US008005637B2

(12) United States Patent  (10) Patent No.: US 8,005,637 B2
Bengtsson et al. (45) Date of Patent: Aug. 23, 2011

(54) METHOD AND APPARATUS FOR MEASURING CHARACTERISTICS OF AN ELECTRICAL DEVICE

(75) Inventors: Tord Bengtsson, Vasteras (SE); Stefan Thorburn, Vasteras (SE)

(73) Assignee: ABB Research Ltd. (CH)

( * ) Notice: Subject to any disclaimer, the term of this patent is extended or adjusted under 35 U.S.C. 154(b) by 140 days.

(21) Appl. No.: 12/486,418

(22) Filed: Jun. 17, 2009

(65) Prior Publication Data

US 2009/0254297 A1   Oct. 8, 2009

Related U.S. Application Data

(63) Continuation of application No. PCT/EP2007/064492, filed on Dec. 21, 2007.

(30) Foreign Application Priority Data

Dec. 22, 2006  (EP) .................................... 06127005

(51) Int. Cl.
*G01R 31/00* (2006.01)
*G06F 17/40* (2006.01)
(52) U.S. Cl. ........ 702/117; 702/124; 702/126; 324/73.1
(58) Field of Classification Search .................. 702/117, 702/57, 64, 65, 124, 126
See application file for complete search history.

(56) References Cited

U.S. PATENT DOCUMENTS

| 4,390,835 | A | | 6/1983 | Elkateb et al. | |
|---|---|---|---|---|---|
| 5,448,491 | A | * | 9/1995 | Janke et al. | 702/58 |
| 5,450,328 | A | * | 9/1995 | Janke et al. | 702/65 |
| 6,230,105 | B1 | * | 5/2001 | Harris et al. | 702/57 |
| 2002/0140433 | A1 | * | 10/2002 | Lawson et al. | 324/509 |
| 2004/0076872 | A1 | | 4/2004 | Kinoshita et al. | |
| 2007/0241759 | A1 | * | 10/2007 | Williams | 324/600 |

FOREIGN PATENT DOCUMENTS

| EP | 1890369 A1 | 2/2008 |
|---|---|---|
| GB | 2070869 A | 9/1981 |
| GB | 2286934 A | 8/1995 |
| WO | 9605516 A1 | 2/1996 |
| WO | 03016850 A2 | 2/2003 |

OTHER PUBLICATIONS

Zaengl, W.S.; "Dielectric Spectroscopy in Time and Frequency Domain for HV Power Equipment, Part I: Theoretical Considerations" IEEE Electrical Insulation Magazine, vol. 19, issue 5, Aug. 2001; pp. 5-19.

(Continued)

*Primary Examiner* — Hal D Wachsman
(74) *Attorney, Agent, or Firm* — St. Onge Steward Johnston & Reens LLC

(57) ABSTRACT

An arrangement to determine at least one electrical feature of an electrical device including a signal injection unit configured to inject first and second test signals into the electrical device, a signal conversion unit configured to measure electrical qualities in electrical circuits resulting from the test signals, and a processing device including at least two input channels configured to receive the measured electrical quantities and to determine the electrical feature based on the measured electrical quantities. The arrangement further may include a mixing unit configured to add the measurements of a first electrical quantity determined from the test signals and based thereon generate a first mixed signal, to add the measurements of a second electrical quantity from the test signals and based thereon generate a second mixed signal, and to supply the first and second mixed signals to first and second input channels.

22 Claims, 4 Drawing Sheets

OTHER PUBLICATIONS

European Search Report; EP 06 12 7005; May 23, 2007; 3 pages.
International Search Report and Written Opinion of the International Searching Authority; PCT/EP2007/064492; Apr. 8, 2008; 7 pages.

J Hedberg and T Bengtsson; "Straight Dielectric Response Measurements with High Precision"; conference proceedings from Nord-IS 2005, paper 27; 4 pages.

* cited by examiner

METHOD AND APPARATUS FOR MEASURING CHARACTERISTICS OF AN ELECTRICAL DEVICE

CROSS-REFERENCE TO RELATED APPLICATIONS

The present application is a continuation of pending International patent application PCT/EP2007/064492 filed on Dec. 21, 2007 which designates the United States and claims priority from European patent application 06127005.4 filed on Dec. 22, 2006, the content of which is incorporated herein by reference.

FIELD OF THE INVENTION

The invention relates to an arrangement and a method to determine an electrical feature, such as an impedance or a transfer function, of an electrical device. The arrangement comprises a signal injection unit configured to inject a first test signal at a first main frequency into a first electric circuit, and to inject a second test signal at a second main frequency into the first electric circuit or into a second electric circuit, a signal conversion unit configured to measure a first and a second electrical quantity, such as current and voltage, in the first electrical circuit resulting from the first test signal, and to measure the first and second electrical quantity in the first or second electric circuit resulting from the second test signal, and a processing device including at least two analogue input channels configured to receive the measured electrical quantities and to determine the electrical feature based on the measured electrical quantities.

BACKGROUND OF THE INVENTION

The first electrical device is a device, the operating voltage and/or current of which is high enough to become dangerous for an operator or to cause some damage in the surrounding equipment in case of an electrical fault. Therefore, the electrical behaviour of the first electrical device has to be monitored in order to be able to react quickly enough in case of a fault. In most situations, the power supply will be switched off as soon as a fault is detected.

In the field of power generation, transmission and distribution, the monitoring of the corresponding electrical devices, such as generators, transformers or transmission lines, is essential to ensure reliability and stability of the power grid. In "Dielectric Spectroscopy in Time and Frequency Domain for HV Power Equipment, Part I: Theoretical Considerations" by Zaengl, W. S.; IEEE Electrical Insulation Magazine, vol. 19, issue 5, pages 5-19, the method of dielectric spectroscopy is introduced as a means to diagnose electric insulation materials used in power engineering. Dielectric spectroscopy may also be called impedance spectroscopy, and it is based on the reaction of a material to an applied electromagnetic field at a certain frequency. In most general terms, the response of the material to the applied AC field is determined by measuring the complex voltage and the complex current over the material simultaneously and by determining the impedance of the material at the specific frequency. The dielectric spectroscopy technique, or the dielectric response measurement technique as it may also be called, is further described in "Straight Dielectric Response Measurements with High Precision" conference proceedings from Nord-IS 2005, paper 27 by J Hedberg and T Bengtsson.

In the European patent application EP 1 890 369 A1, the method of dielectric spectroscopy is used to improve the accuracy of a ground fault detection method applied to a stator winding of a multiple-phase generator. A ground fault in the stator winding, which is an internal fault and which can be caused by physical damage or ageing of the insulation material of the winding, precedes generally all other possible faults of the generator, such as phase-to-phase faults of the stator. Accordingly, it is important to detect the ground fault in the winding to prevent more severe faults in the generator. The stator of the generator is connected and the neutral point is connected to ground through an impedance. For the dielectric spectroscopy, an AC test signal is injected between the neutral point and ground and the response of the stator winding to that AC signal is measured. From the measurements, a fault impedance to ground is determined, where the fault impedance is modelled as a fault resistance in parallel to a winding capacitance.

WO 96/05516 discloses a system for monitoring a dual voltage ungrounded system. The monitoring system is configured to determine a fault impedance by injecting test current into a ground terminal to generate a measurement voltage across the fault impedance. The impedance is calculated by using the measurement voltage and the current. In order to determine the impedances of both phases in a dual voltage system, two test currents, having different frequencies, are injected to generate two measurement voltages. The frequencies of the currents are multiples of the system frequency. The test currents and measured voltages are supplied to a micro controller unit, which is configured to calculate the impedance of the two phases. Each of the measured currents and voltages is supplied to an analogue input channel of the micro controller. Thus, the number of input channels needed depends on the number of measurements. In this case four input channels are needed. However, the number of input channels is limited. For example, in a relay box the number of input channels is limited to 12 or 24. Most of those input channels are used for other purposes. Costs are associated with having more channels In the existing processing devices, which are used in power engineering, measurements are delivered via input channels as analogue signals to the processing device, which transforms the signals into digital data. The processing device usually fulfils several tasks. These tasks are often the controlling, protection and supervision not only of the one electrical device but also of a whole facility. As a result, one such processing device can be quite costly. Since the processing device receives the measurements as analogue signals, the number of input signals is limited. Accordingly, the more measurements that are desired to be processed, the more analogue inputs are required which results in a costly hardware extension. Apart from that, the time and effort used for wiring and installation are increased.

In today's electrical facilities the aspects of increased performance, reliability and safety on one side and of higher efficiency and reduced costs on the other side have to be balanced.

SUMMARY OF THE INVENTION

Therefore, an object of the invention is to reduce the costs of the measuring arrangement and still maintain the performance and reliability of the arrangement.

Such an arrangement is characterized in that the arrangement comprises a mixing unit configured to add the measurements of the first electrical quantity resulting from the first test signal and the measurements of the first electrical quantity resulting from the second test signal and based thereon generate a first mixed signal, to add the measurements of the second electrical quantity resulting from the first test signal and the measurements of the second electrical quantity resulting from the second test signal and based thereon generate a second mixed signal, to supply the first mixed signal to a first input channel of the processing device and to supply the second mixed signal to a second input channel of the processing device, and the processing device is configured to decompose the mixed signals to obtain the measurements of the first and second electrical quantities.

To achieve the object of the invention, a mixing unit is introduced which adds the first measurement of the first quantity and the second measurement of the first quantity and supplies the mixed signal to a first input channel of the process device. For example, the first quantity is a voltage. With adding is meant summing of the analogue measuring signals. The mixing unit also adds the first measurement of the second quantity and the second measurement of the second quantity and supplies the mixed signal to a second input channel. For example, the second quantity is a current. The processing device then obtains the measurements of the first and second electrical quantities by decomposing the mixed signals and based thereon determines the electrical feature. For example, the electrical feature is an impedance or a transfer function. An advantage with the present invention is that only two input channels is needed independent of the number of measurements, and consequently hardware costs are reduced. Another advantage with the present invention is that the frequency of the test signals is independent of the system frequency, also called the fundamental frequency.

Only a comparatively minor unit, the mixing unit, has to be added, which can be flexibly adapted to the current requirements. The processing device needs only to be updated in its operation software to implement the additional function of obtaining the single voltage and current values from the mixed signals.

The first and the second electrical devices are preferably devices used in electric power generation, transmission and distribution, such as generators, transformers, motors or transmission lines. The injected test signals can be voltage or current signals. The term main frequency illustrates that the first and second test signals are time-varying signals the frequency spectrum of which shows one clearly dominating frequency. The simplest embodiment is a sinusoidal test signal. But a composition of different frequencies is also applicable as long as one main frequency can be detected. To obtain the voltages and currents from the mixed signals, the processing device uses preferably an FFT-based algorithm (Fast Fourier Transform) which separates the measurements at the first and the second main frequencies from each other and determines complex voltage and current values.

It is advantageous to choose the first and the second main frequency at an off-nominal value of the respective device, i.e. at a value that can be clearly distinguished from any other harmonic present in the first or the second electrical device, respectively. This is especially useful in case that the first or the second electrical device, respectively, is an AC device or that units are added to the auxiliary system of the electrical device which may function as a source of AC signals, such as speed gauges.

In an embodiment of the invention, the first electrical quantity can be a first voltage and the second electrical quantity can be a second voltage. In another embodiment of the invention, the first electrical quantity can be a first current and the second electrical quantity can be a second current.

According to an embodiment of the invention, two or more electrical features are determined for the electrical device. The electrical feature is a possible indicator for a fault. If more than one electrical feature is determined for exactly the same part of the first electrical device, redundancy is introduced which improves the availability of the fault detection. If different sources of fault are monitored by determining the electrical quantities of different electrical devices in a facility, unfavourable interactions of a healthy device with a faulty device can be prevented which increases the overall reliability of the facility.

To monitor more than one electrical feature and to achieve the object of the invention, the frequency injection unit injects a second test signal at a second main frequency into the first electric circuit or into a second electric circuit, where the second electric circuit is connected with a second electrical device, and the signal conversion unit measures the first electrical quantity and the second electrical quantity in the first or the second electric circuit, which result from the second test signal. The processing device determines a second electrical feature of the first or of the second electrical device from the second voltage and current.

According to an embodiment of the invention, the frequency injection unit is configured to inject at least a third test signal at a third main frequency into the first electric circuit, the signal conversion unit is configured to measure the first and second electrical quantity in the first electric circuit resulting from the third test signal, and the mixing unit is configured to add the measurements of the first electrical quantity from the first, second and third test signals and based thereon generate a first mixed signal, to add the measurements of the second electrical quantity from the first, second and third test signals and based thereon generate a second mixed signal. Although, information on six independent measurements are supplied to the processing unit, only two input channels are needed. This can be applied, for example, to measure three electrical impedances to ground of the three phases of a three-phase power transmission or distribution line. This embodiment further reduces the hardware costs.

According to an embodiment of the invention, the signal conversion unit is configured to measure a first voltage and a first current in the first electric circuit, where the first voltage and current result from the first test signal, and to measure a second voltage and a second current in the first or the second electric circuit, where the second voltage and current result from the second test signal, and the processing device is configured to determine a first impedance of the first electrical device from the first voltage and current, and a second impedance of the first or of the second electrical device from the second voltage and current. In this embodiment the impedance of the first electrical unit is determined based on voltage and current measurements.

According to an embodiment of the invention, the mixing unit comprises a first amplifier to amplify the signal of the first voltage measurement and a second amplifier to amplify the signal of the second voltage measurement and where the first and the second amplifiers are connected in series and the output of their serial circuit is connected to the first analogue input channel. The same arrangement of series connected amplifiers may be used to add the current measurements.

The series-connected amplifiers not only fulfil the task of summation of analogue signals but serve also as means to adjust the amplitudes of their outputs to match the input range of the processing device, since the maximum possible output value of the amplifiers can be determined by their supply voltage. Advantageously, this adjustment of the amplifiers can be changed and fine tuned for each new use case which ensures a high flexibility of the mixing unit. In addition, the amplifiers decouple the injection and signal conversion units from the processing device so that they have minimal impact on each other.

In an alternative embodiment, transformers may be used instead of amplifiers in the mixing unit. The signals of the voltage or current measurements, respectively, are connected to two corresponding input windings of one transformer and the corresponding first or second input channel is connected to the output winding of that transformer. The transformers may at the same time be used to adjust the amplitude of the output voltages to the input range of the processing device by choosing a suitable transformer ratio The electrical quantity measurement arrangement and method according to the invention may be used to detect faults in the first or the second electrical device by comparing the measured electrical quantity with a specific value or with a predefined range of electrical quantities. If the measured electrical quantity is too far away from the specific value or leaves the predefined range, a fault is detected. The fault detection may be used for different application purposes. One application may be the ground fault detection of the first or the second electrical device, where an impedance to ground of the respective device needs to be determined. If the real part of the impedance falls below a predetermined value, a ground fault is detected. Another possible application is the detection of a fault in the first or second electrical device even before the device is energized, by injecting the first and second test signal into the deenergized device. This reduces the risk of severe damages which may occur when a faulty device is connected to its power supply.

In case that the first electrical device is a three-phase electrical generator, the electrical quantity measurement can also be used to recognize a damaged neutral resistor in the generator grounding point, a condition which is not immediately damaging for the equipment but can cause hazard for people and excessive voltage stress on the equipment if a fault occurs. A trip logic may be arranged to react on the electrical quantity value, where the reaction should be differently according to the current operating state of the generator, such as standstill, the energized or the synchronized state.

In order to improve the accuracy of a fault detection which is based on the electrical quantity measurement, a temperature compensation is provided in a special embodiment of the invention. Under certain working conditions of the electrical devices, high temperature variations may occur which influence the result of the electrical quantity measurement considerably. In order to be able to compensate for temperature changes it is therefore suggested according to one embodiment to use one or multiple temperature measuring means to determine a working temperature of at least one part of the first and/or the second electric circuit and where the processing device uses the working temperature of the respective circuit to correct the first and/or the second voltage and currents. It is further suggested to measure the temperature of the first and/or the second electrical device directly.

In a specific embodiment of the invention, the safety of a three-phase electrical machine is improved by monitoring the fault condition of its stator and its rotor winding. As described above, the winding of a three-phase electrical motor or generator may become faulty due to ageing or mechanical damage of the winding isolation. This may cause an internal fault which may develop into a severe phase-to-phase fault or a turn-to-turn short circuit via two simultaneous ground faults. Since these faults are not only dangerous but costly to repair afterwards, it is essential to detect an internal fault in the winding at an early stage. Accordingly, the first electrical quantity is measured at the stator winding and the second electrical quantity is measured at the rotor winding. The processing device compares the first electrical quantity with a first predetermined value to detect a fault in the stator winding and it compares the second electrical quantity with a second predetermined value to detect a fault in the rotor winding.

In another embodiment, the safety of a three-phase electrical generator is improved by introducing redundancy in the stator protection. In one possible arrangement, the stator electrical quantity is determined by injecting the two test signals at two different frequencies from one and the same signal injection unit, and by measuring and processing the response using different parts of the signal conversion and the mixing units as well as different input channels and different inputs of the processing device. A full redundancy of the stator protection is achieved by doubling the whole electrical quantity measurement arrangement, where the additional electrical quantity measurement arrangement injects at least one test signal at a frequency different from the frequencies injected by the first arrangement. The first arrangement may then be used to perform stator and rotor protection simultaneously. This embodiment can be further extended if the additional electrical quantity measurement arrangement measures also the electrical quantities of stator and rotor, so that redundant electrical quantity values are determined for both stator and rotor.

One form of stator protection is stator ground fault protection. As described in the prior art, stator ground fault protection is applicable if the stator of the three-phase electrical machine is wye connected with a ground neutral. To determine two ground electrical quantities of the stator, two test signals at different frequencies need to be injected between the neutral and ground.

In addition to measuring an impedance and recognizing a fault from its value, fault detection can be improved or extended by monitoring the voltage and current measurements themselves. A zero current for example indicates an open circuit, a zero voltage can be an error in the injection unit for which appropriate alarms should be given.

BRIEF DESCRIPTION OF THE DRAWINGS

The invention is now described by way of example with reference to the accompanying drawings in which.

DETAILED DESCRIPTION OF THE INVENTION

In the following examples the impedance is determined based on voltage and current measurements. However, the invention is not limited to determining the impedance. It is also possible to determine a transfer function based on two voltage measurements or two current measurements.

Figure 1:
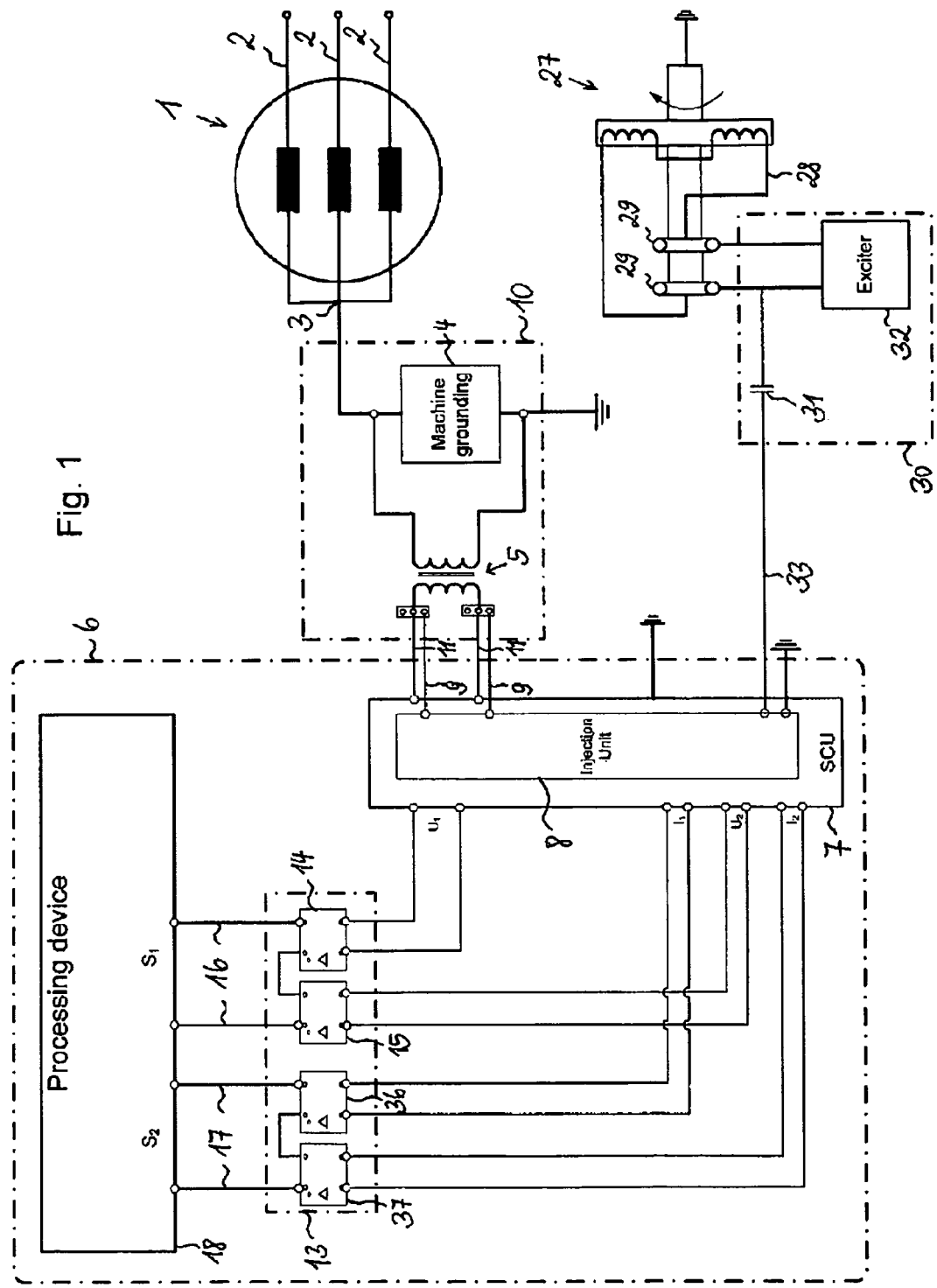
FIG. 1 shows a schematic diagram of an arrangement to determine the ground electrical quantities of the stator and rotor winding of a three-phase generator.

FIG. 1 shows a three-phase generator 1 with its stator windings 2 and its rotor windings 28. The stator windings 2 are wye connected and the neutral 3 is grounded via the machine grounding unit 4. A voltage transformer 5 is used to transform the voltages in the stator grounding circuit down to a measurable level. Instead of the voltage transformer 5, an open delta transformer may be used. The combination of the machine grounding unit 4 and the voltage transformer 5 is regarded in the following as first electric circuit 10 being connected with the stator windings 2, where the stator windings 2 represent a first electrical device. The rotor windings 28 of the rotor 27 of the generator 1 are connected via two slip rings 29 to an exciter 32. The rotor windings 28 are regarded as a second electrical device. A second electric circuit 30 is connected to the rotor windings 28, which is formed of the exciter 32 and a coupling capacitor 31.

An arrangement 6 is used to measure the neutral to ground impedance of the stator in order to detect an internal ground fault of the stator windings 2. The arrangement 6 comprises a signal conversion unit 7 which in turn comprises a signal injection unit 8. The signal injection unit 8 generates a first test signal $t_1$ at a first main frequency $f_1$ and a second test signal $t_2$ at a second main frequency $f_2$. The signals can in the simplest case be sinusoidal signals, i.e. the respective main frequency $f_1$ or $f_2$ is the only frequency contained in the signal. But they can also have any other suitable shape comprising multiple frequencies with one dominant frequency $f_1$ or $f_2$, as for example a rectangular pulse signal. The main frequencies $f_1$ and $f_2$ are chosen to be asynchronous to any other harmonic present in the generator 1, so that the main frequencies $f_1$ and $f_2$ are distinguishable and can be picked out from the spectrum of signals measurable in the stator windings 2.

Figure 2:
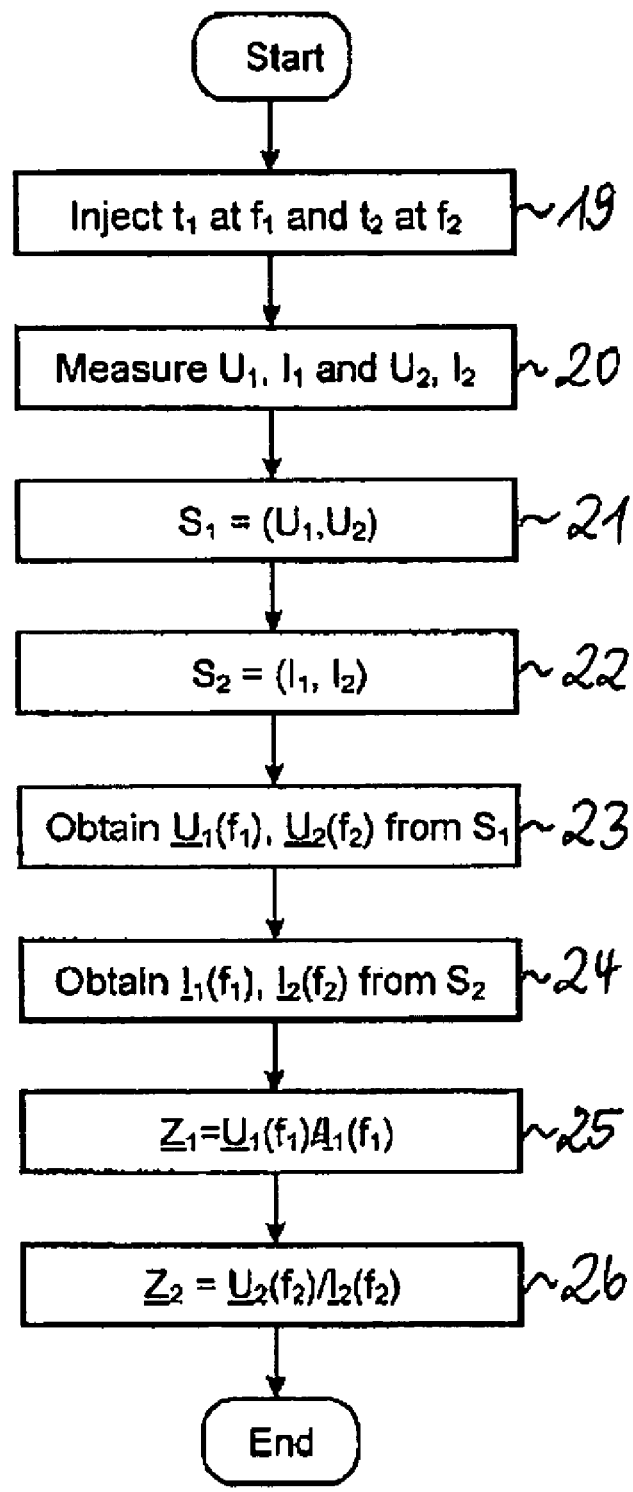
FIG. 2 shows a flow chart of a method to determine two electrical quantities.

The first test signal $t_1$ is applied via the connection 9 to the low voltage side of the first electric circuit 10, thereby injecting the test signal $t_1$ into the first electric circuit 10. The second signal $t_2$ is injected via the connection 33 into the second electric circuit 30 and thereby into the rotor windings 28. This is the beginning step 19 of a method to determine the electrical quantities of the stator windings 2 and the rotor windings 28, as illustrated in FIG. 2. The response of the stator windings 2 to the first test signal $t_1$ and the response of the rotor windings 28 to the second test signal $t_2$ is measured by the signal conversion unit 7 which is connected via the connecting lines 11 with the first electric circuit 10 and via line 33 with the second electric circuit 30. The corresponding analogue voltage signals representing the measured voltage and current of the responses, respectively, are output as first voltage measurement $U_1$ and first current measurement $I_1$ and as second voltage measurement $U_2$ and as second current measurement $I_2$. The corresponding method step 20 is shown in FIG. 2.

The four measurements are transmitted to a mixing unit 13 which comprises a serial circuit of a first and a second amplifier 14 and 15 and another serial circuit of a third and a fourth amplifier 36 and 37. The first voltage measurement $U_1$ is input to the first amplifier 14 and the second voltage measurement $U_2$ is input to the second amplifier 15. Since the output of the serial circuit of the first and the second amplifiers is connected to a first analogue input channel 16, a summation of the first and the second output voltages $U_1$ and $U_2$ is performed, thereby generating a resultant signal $S_1$. The corresponding method step is referenced as step 21. The same summation is performed for the first and second current measurements $I_1$ and $I_2$ via the third amplifier 36 and the fourth amplifier 37. This is also illustrated by step 22. The resultant signal $S_2$ is transmitted to a second analogue input channel 17.

A processing device 18 is connected to the first and the second analogue input channels 16 and 17 in order to receive the mixed signals $S_1$ and $S_2$. The processing device 18 decomposes the first mixed signal $S_1$ to obtain the first and the second voltage measurements $U_1$ and $U_2$, and it decomposes the second mixed signal $S_2$ to obtain the first and the second current measurements $I_1$ and $I_2$. The decomposition can, for example, be made as described in the "Straight Dielectric Response Measurements with High Precision" by J. Hedberg and T. Bengtsson, Nord-IS 2005, paper 27.

The four voltage and current signals are then analyzed and processed by the processing device 18 to perform the steps described in the following. From the first and second voltage and current measurements, the first and the second main frequencies $f_1$ and $f_2$ are picked out, thereby obtaining phasors of the first and the second voltage and currents at the respective frequencies: $\underline{U}_1(f_1), \underline{U}_2(f_2), \underline{I}_1(f_1), \underline{I}_2(f_2)$. This is illustrated in FIG. 2 by steps 23 and 24.

From the first voltage and current phasors, $\underline{U}_1(f_1)$ and $\underline{I}_1(f_1)$, a first impedance $\underline{Z}_1$ is calculated according to step 25, which in case of FIG. 1 represents the impedance of the stator winding 2, and from the second voltage and current phasors, $\underline{U}_2(f_2)$ and $\underline{I}_2(f_2)$, a second impedance $\underline{Z}_2$ is calculated according to step 26, which represents the impedance of the rotor winding 28. Then, the two electrical quantities are used for fault detection, by comparing them with respective predetermined values. The impedance $\underline{Z}_1$ or $\underline{Z}_2$ which has a smaller real part than the predetermined value indicates a ground fault of the respective winding. Appropriate measures can then be initiated by the processing device 18 to prevent any serious damage of the generator 1, like for example the issuing of a trip signal. As can be seen, the merit of the invention in this application case is that the stator and the rotor windings can be detected while using only two analogue input channels 16 and 17.

Figure 3:
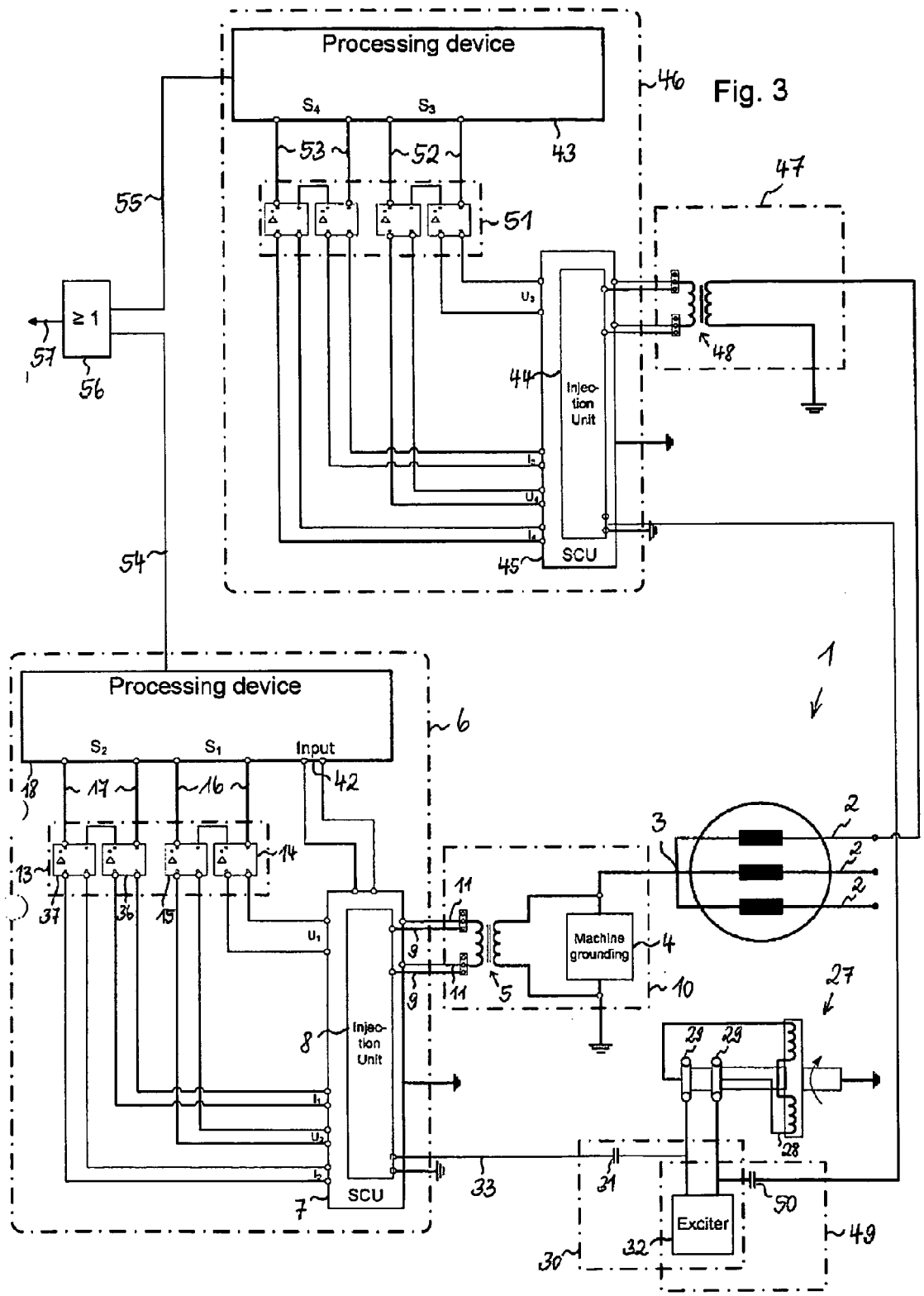
FIG. 3 shows the arrangement of FIG. 1 where the arrangement was doubled to measured redundant stator and rotor electrical quantities.

FIG. 3 shows the same elements as FIG. 1. Additionally processing device 18 shows a further input 42 to illustrate that the processing device 18 performs additional tasks than the electrical quantity measurement and stator and rotor ground fault detection. Such additional tasks can be various generator protection and/or control functions known in the art. In FIG. 3, a further processing device 43, a further signal injection unit 44 integrated in a further signal conversion unit 45 are provided in an arrangement 46 to perform a redundant stator and rotor winding fault detection. For measuring a third impedance $\underline{Z}_3$ at the stator windings 2, a third test signal $t_3$ at a third main frequency $f_3$ is injected into the stator windings 2 via a third electric circuit 47 containing a voltage transformer 48. And the redundant impedance of the rotor windings 28 is measured as a fourth impedance $\underline{Z}_4$ from the response to a fourth test signal $t_4$ at a fourth main frequency $f_4$, which is injected into the rotor windings 28 via a fourth electric circuit 49 containing a coupling capacitor 50 being connected to the exciter 32. In a further mixing unit 51 the third and fourth voltage and current measurements $U_3, U_4, I_3, I_4$ are supplied analogously to mixing unit 13. The summed voltage measurements are then transmitted as a third mixed signal $S_3$ to the further processing device 43 via a third analogue input channel 52 and the summed current measurements are transmitted as a fourth mixed signal $S_4$ via a fourth analogue input channel 53. The further processing device 43 detects a ground fault in the stator and or the rotor windings from the third and the fourth mixed signals $S_3$ and $S_4$ in the same way as the processing device 18 from the first and second mixed signals $S_1$ and $S_2$. Both processing devices 18 and 43 generate a trip signal 54 and 55, respectively, which is then OR connected in a logic unit 56 in order to generate an output trip signal 57 which initiates the disconnection of the generator from its power supply.

Figure 4:
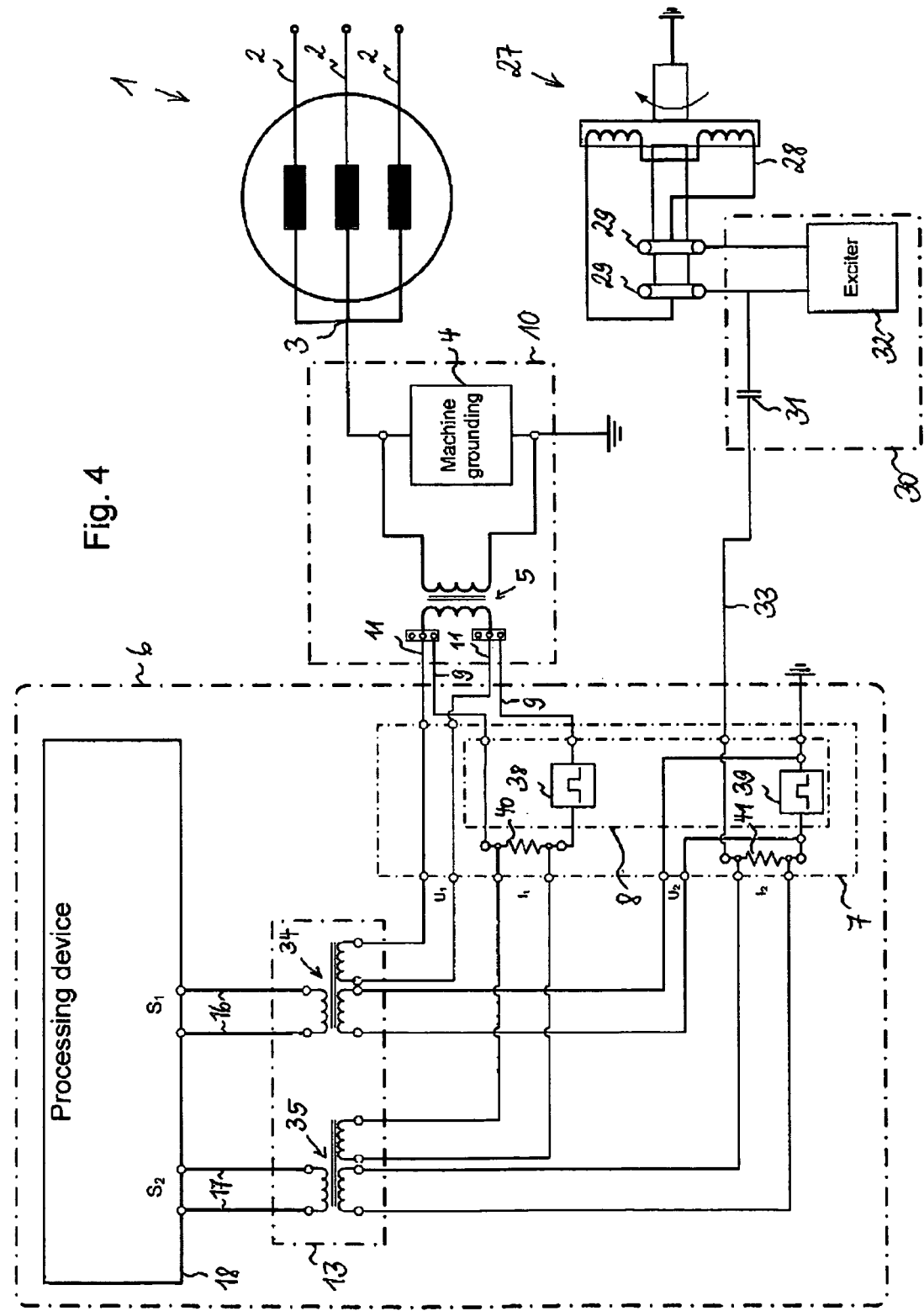
FIG. 4 shows the arrangement of FIG. 1 with voltage transformers instead of amplifiers.

FIG. 4 shows the same system as FIG. 1 to determine the electrical quantities of the stator windings 2 and of the rotor windings 28. But instead of the two amplifier units 14 and 15, the mixing unit 13 comprises a first voltage transformer 34 and a second voltage transformer 35. Apart from that, the signal conversion unit 7 and the injection unit 8 are illustrated more detailed than in FIGS. 1 and 3.

FIG. 4 shows the same system as FIG. 1 to determine the electrical quantities of the stator windings 2 and of the rotor windings 28. But instead of the two amplifier units 14 and 15, the mixing unit 13 comprises a first voltage transformer 34 and a second voltage transformer 35. Apart from that, the signal conversion unit 7 and the injection unit 8 are illustrated more detailed than in FIGS. 1 and 3.

The injection unit 8 comprises a first oscillator 38 to produce the first test signal $t_1$ for the stator windings 2 and a second oscillator 39 to produce the second test signal $t_2$ for the rotor windings 28. Both test signals are of rectangular shape.

The first voltage measurement $U_1$ of the stator windings 2 and the second voltage measurement $U_2$ of the rotor windings 28 are measured directly across the oscillators 38 and 39, respectively. To get the first current measurement $I_1$ and the second current measurement $I_2$, current shunts 40 and are each arranged in series with the corresponding oscillator 38 and 39, respectively.

The lines of the first and the second voltage measurements $U_1$ and $U_2$ are connected to two input windings of the first voltage transformer 34, and the first input channel 16 is connected to its output winding. The lines of the first and the second current measurements $I_1$ and $I_2$ are connected to two input windings of the second voltage transformer 35 and the second input channel 17 is connected to its output winding. The processing of the mixed signals $S_1$ and $S_2$ is performed by the processing device 18 the same way as described with respect to FIG. 1.

What is claimed is:

1. An arrangement to determine at least one electrical feature of at least one electrical device, the arrangement comprising:
    a signal injection unit configured to inject a first test signal at a first main frequency into a first electric circuit, and to inject a second test signal at a second main frequency into the first electric circuit or into a second electric circuit,
    a signal conversion unit configured to measure a first and a second electrical quantity in the first electrical circuit resulting from the first test signal, and to measure the first and second electrical quantity in the first or second electric circuit resulting from the second test signal,
    a processing device including at least two analogue input channels configured to receive said measured electrical quantities and to determine said at least one electrical feature based on the measured electrical quantities, and
    a mixing unit, the mixing unit being configured to add the measurements of the first electrical quantity resulting from the first and second test signals and based thereon generate a first mixed signal, the mixing unit being configured to add the measurements of the second electrical quantity resulting from the first and second test signals and based thereon generate a second mixed signal, and the mixing unit being configured to supply the first mixed signal to a first analogue input channel of the processing device and to supply the second mixed signal to a second analogue input channel of the processing device, and
    wherein the processing device is configured to decompose the mixed signals to obtain the measurements of the first and second electrical quantities.

2. The arrangement of claim 1, wherein said at least one electrical feature is an impedance or a transfer function.

3. The arrangement of claim 1, wherein said first electrical quantity is either voltage or current and said second electrical quantity is either voltage or current.

4. The arrangement of claim 1, wherein the frequency-signal injection unity is configured to inject at least a third test signal at a third main frequency into the first electric circuit, the signal conversion unit is configured to measure the first and second electrical quantity in the first electric circuit resulting from the third test signal, and the mixing unit is configured to add the measurements of the first electrical quantity from the first, second and third test signals and based thereon generate said first mixed signal, add the measurements of the second electrical quantity from the first, second and third test signals and based thereon generate the second mixed signal.

5. The arrangement of claim 1, wherein said signal conversion unit is configured to measure a first voltage and a first current in the first electric circuit, where the first voltage and current result from the first test signal, and
    wherein said signal conversion unit is configured to measure a second voltage and a second current in the first or the second electric circuits, where the second voltage and current result from the second test signal, and
    wherein said processing device is configured to determine a first impedance of a first electrical device from the first voltage and current, and a second impedance of the first or of a second electrical device from the second voltage and current.

6. The arrangement of claim 5, wherein the mixing unit comprises a first amplifier to amplify the signal of the first voltage measurement and a second amplifier to amplify the signal of the second voltage measurement, and
    wherein the first and the second amplifiers are connected in series to a serial circuit and the output of the serial circuit is connected to the first analogue input channel.

7. The arrangement of claim 5, wherein the mixing unit comprises a third amplifier to amplify the signal of the first current measurement and a fourth amplifier to amplify the signal of the second current measurement, and
    wherein the third and the fourth amplifiers are connected in series and the output of the serial circuit is connected to the second analogue input channel.

8. The arrangement of claim 5, wherein the mixing unit comprises a first voltage transformer with the first and the second voltage measurements as inputs and with a connection to the first analogue input channel as output.

9. The arrangement of claim 8, wherein the mixing unit comprises a second voltage transformer with the first and the second current measurements as inputs and with a connection to the second analogue input channel as output.

10. The arrangement of claim 5, comprising a temperature measuring means to determine a working temperature of at least one part of at least one of the first and the second electric circuit and
    wherein the processing device uses the working temperature of the respective circuit to correct at least one of the first and the second voltage and currents.

11. The arrangement of claim 5, wherein the first electrical device is the stator windings of a three-phase electrical machine and where the second electrical device is the rotor windings of the machine and where the processing device compares the first impedances with a first predetermined value to detect a fault in the stator windings and the second impedance with a second predetermined value to detect a fault in the rotor windings.

12. The arrangement of claim 11, wherein the stator windings are wye connected with a grounded neutral and where the injection unit injects the first test signal between the neutral and ground.

13. The arrangement of claim 11, wherein the injection unit injects the second test signal through a capacitor into an excitation circuit of the rotor windings.

14. The arrangement of claim 11, wherein redundancy is obtained by:
- a further signal injection unity which injects a third test signals at a third main frequency into a third electric circuits which is connected with the stator windings,
- a further signal conversion unity which measures a third voltage and a third current resulting from the third test signal, and
- a further processing device which determines a third impedance from the third voltage and current.

15. The arrangement of claim 1, where in case that at least one of a first and a second electrical device is an AC device, the first and the second main frequencies are off-nominal frequencies of the at least one of the first and the second electrical device, respectively.

16. The arrangement of claim 1, comprising additionally a temperature measuring means to deter-mine a working temperature of at least one of a first and a second electrical device and where the processing device uses the working temperature of the respective device to correct at least one of the first and the second electrical quantities.

17. The arrangement of claim 1, wherein the signal injection unit injects at least one of the first and the second test signal via a voltage transformer into a first or a second electrical device.

18. The arrangement of claim 17, wherein the first or the second electrical device is a power device and the signal injection unit injects at least one of the first and the second test signal into at least one phase of the power device.

19. The arrangement of claim 1, where the signal injection unit injects at least one of the first and the second test signal via an open delta transformer into a first or a second electrical device.

20. A method to determine an electrical characteristic of at least one electrical device, comprising:
- injecting a first test signal at a first main frequency into a first electric circuit,
- injecting a second test signal at a second main frequency into the first electric circuit or into a second electric circuit,
- measuring a first and a second electrical quantity in the first electrical circuit resulting from the first test signal,
- measuring the first and second electrical quantity in the first or second electric circuit resulting from the second test signal,
- adding the measurements of the first electrical quantity resulting from the first and second test signals and based thereon generating a first mixed signal,
- adding the measurements of the second electrical quantity resulting from the first and second test signals and based thereon generating a second mixed signal,
- supplying the first mixed signal to a first analogue input channel of a processing device,
- supplying the second mixed signal to a second analogue input channel of the processing device,
- receiving said measured electrical quantities via said two analogue input channels,
- decomposing the mixed signals to obtain the measurements of the first and second electrical quantities, and
- determining said electrical characteristic based on the measured electrical quantities.

21. The method of claim 20, further comprising:
- measuring a first voltage and a first current in the first electric circuit, where the first voltage and current result from the first test signal,
- measuring a second voltage and a second current in the first or the second electric circuits, where the second voltage and current result from the second test signal,
- adding the first and the second voltage measurements,
- adding the first and the second current measurements,
- obtaining the first and the second voltages from the mixed signal of the first analogue input channel and the first and the second currents from the mixed signal of the second analogue input channel,
- determining a first impedance of a first electrical device from the first voltage and current, and
- determining a second impedances) of the first or of a second electrical device from the second voltage and current.

22. The method of claim 21, wherein the first and the second electrical quantities are determined before the first or the second electrical device is energized.

* * * * *